United States Patent
Hayes, Jr. et al.

(10) Patent No.: US 8,415,831 B1
(45) Date of Patent: Apr. 9, 2013

(54) HIGH DENSITY POWER SUPPLY CABINETS

(75) Inventors: Thomas Allen Hayes, Jr., Anchorage, AK (US); Lara Henry Baker, Anchorage, AK (US)

(73) Assignee: Sequestered Solutions Alaska, LLC, Anchorage, AK (US)

( * ) Notice: Subject to any disclaimer, the term of this patent is extended or adjusted under 35 U.S.C. 154(b) by 532 days.

(21) Appl. No.: 12/316,448

(22) Filed: Dec. 11, 2008
(Under 37 CFR 1.47)

(51) Int. Cl.
*H02J 7/00* (2006.01)
*H02J 9/00* (2006.01)

(52) U.S. Cl. ........................................ 307/66
(58) Field of Classification Search ............. 307/66
See application file for complete search history.

(56) References Cited

U.S. PATENT DOCUMENTS

| | | | | |
|---|---|---|---|---|
| 7,215,535 B2* | 5/2007 | Pereira | | 361/624 |
| 2005/0225914 A1* | 10/2005 | King | | 361/62 |
| 2008/0042491 A1* | 2/2008 | Klikic et al. | | 307/66 |
| 2009/0059518 A1* | 3/2009 | Kakikawa et al. | | 361/687 |
| 2010/0039771 A1* | 2/2010 | Marchand | | 361/694 |

\* cited by examiner

*Primary Examiner* — Rexford Barnie
*Assistant Examiner* — Dru Parries
(74) *Attorney, Agent, or Firm* — Stoel Rives LLP

(57) ABSTRACT

A High-Density Cabinet (HDC) that houses standard rack-mountable electronic equipment in a high-density configuration that also protects the equipment from transient electrical-supply problems. The standard HDC configuration provides up to 7,200 Watts of power at 110V or 220V AC with a backup supply lasting 30 minutes. The rack used for the HDC is approximately 2'5" wide, 7'4" high and approximately 3'2" deep. The batteries in the HDC are located in the base of the HDC; the UPSs are located at the bottom of the HDC on a hinged-tray. This equipment takes up the bottom six RUs of the HDC; leaving 36 RUs available for production electronic equipment. The HDC also uses DIN-Rail blocks, which allow the safe, accessible, and unobtrusive connection of approximately 72 AC power cords into 36 sets of DIN-Rail blocks, in a space about 18" high by 4" wide and 2" deep.

18 Claims, 20 Drawing Sheets

HIGH DENSITY POWER SUPPLY CABINETS

CROSS REFERENCE TO RELATED APPLICATIONS

Not Applicable

STATEMENT REGARDING FEDERALLY SPONSORED RESEARCH AND DEVELOPMENT

Not Applicable

BACKGROUND OF THE INVENTION

1. Field of the Invention

This invention relates to high-density power supply cabinets and particularly to high-density power supply cabinets with integrated remote monitoring capabilities.

2. Description of the Prior Art

Over its existence, the physical size of electronic equipment (such as computer servers and storage) has shrunk, its capabilities have increased, and its power density has dramatically increased. At the same time, most sophisticated electronic equipment remains dependent on a continuous supply of clean electrical power. These two demands (continuity and quality) have traditionally been met with two different capabilities—backup power supplies and uninterruptible power supplies. Traditionally, the backup power supply need has been met by using some kind of electromechanical source, such as Diesel-fired or natural-gas-fired generators. While these sources can provide backup power, it is usually very uneconomical to use these same sources for ensuring power quality and continuity—that task has traditionally fallen to uninterruptible power supplies (UPSs). Any reasonable design for a UPS will include all circuitry needed for power conditioning as well as for temporary power provisioning. UPSs can exist at the equipment level, at the rack level, or at the building or facility level.

Building-level UPSs have proven to be an effective and efficient solution to the power quality and continuity problems, but must usually be designed into the building at construction; after building construction is completed, adding a building-level UPS is extraordinarily expensive. Equipment-level UPSs can be effective in an office or home environment, but are quite inefficient when used for dense, rack-mounted equipment. Equipment-level UPSs take up a lot of valuable rack space, and are difficult to manage and control. A near-optimal solution seems to be UPSs that provide power to an entire rack.

Most modern electronic-equipment racks provide about 42 Rack Units (RUs) of space for installing equipment. Enough traditional, rack-mounted UPSs to supply a sufficient amount of power would take up more space in the rack that is practical.

As modern rack-mounted electronic equipment has become smaller and more powerful, it has thereby increased the demands for more power in a smaller space. Ignoring the need for uninterruptible power, a modern electronics rack could house 36 servers, each of which could have two power cables (one each for two redundant power supplies internal to the equipment), two network cables (one each for two redundant connections from two network interfaces to two network switches), and up to three cables for server control (either "KVM" (keyboard, video, and mouse) or "ILO" (Integrated Lights Out)). That adds up to as many as 252 cables in a space 19" wide and 74.5" high. The result is a tangle of cables at the back of the rack that looks like a "nest of snakes". To hold all this cabling, many manufacturers have made available "wide cabinets," as commercial off the shelf (COTS) products. These cabinets are about ten inches wider than standard racks to allow for cabling and cooling.

BRIEF DESCRIPTION OF THE INVENTION

The instant invention is a High-Density Cabinet (HDC) that houses standard rack-mountable electronic equipment in a very high-density configuration that also protects the equipment from transient electrical-supply problems. The standard HDC configuration will provide up to 7,200 Watts of power at 110V or 220V AC with a design power-backup supply lasting 30 minutes.

An HDC occupies approximately 25 square feet of data-center space—this allows room for excess cooling air and for physical access with all the doors in the HDC completely open.

The wide rack used as the basis for the HDC is approximately 2'5" wide, 7'4" high and approximately 3'2" deep The batteries in the HDC are located in the base of the HDC; the UPSs are located at the bottom of the HDC on a hinged-tray in the back of the HDC. This equipment takes up the bottom six RUs of the HDC; leaving 36 RUs available for production electronic equipment.

The HDC also solves the simple problem of the physical space required to plug in 72 power cables to the available input power. Allowing for space between plugs, using standard, three-prong power plugs would require essentially all the space available at the sides in the back of the HDC. The HDC solution involves the use of DIN-Rail blocks, which allow the safe, accessible, and unobtrusive connection of approximately 72 AC power cords into 36 sets of DIN-Rail blocks, in a space about 18" high by 4" wide and 2" deep. This space is located at the back of the rack, against the side of the HDC, on whichever side of the HDC is appropriate for the application. These DIN-Rail blocks are fed from three, 3600 W UPSs, nominally one per phase of the incoming AC power. Obviously, an HDC can be configured with a smaller electrical feed and with concomitantly smaller available total power, but with a tolerance for longer power outages.

The HDC contains eight sealed, 12V, Gel batteries, with 110 Amp-Hours available from each battery. As the batteries are completely sealed, they require no maintenance, whatsoever.

As normally configured, the HDC contains an extensive monitoring network. The HDC is configured with sensors that monitor cabinet temperature, power load by phase, operation of the UPSs, and sensors that allow the detection of a "heartbeat" for servers in the HDC. Nominally, the heartbeat of a server is checked every 33 msec. The monitoring data and the health of the monitoring system, itself, is available through a serial connection in the HDC.

The monitoring components and the UPSs are the only truly active components in the HDC. The only required preventative maintenance (PM) in the HDC is checking for dust and dirt buildup in the UPS fans at intervals that depend on the environment housing the HDC.

As implemented, the HDC has no inherent Single Point-of-Operational-Failure (SPOF). The monitoring components in the HDC are not redundant, but loss of monitoring does not affect equipment operations.

DETAILED DESCRIPTION OF THE INVENTION

As noted above, the standard HDC configuration will provide up to 7,200 Watts of power at 110V or 220V AC with a design power-backup supply lasting 30 minutes. In a degraded, worst-case condition, with over-age batteries, some failed batteries, and one failed Uninterruptible Power Supply (UPS), the standard HDC will still provide five minutes of stand-by power at 7,200 watts of load. An HDC is assumed to occupy 25 square feet of datacenter space—this allows room for excess cooling air and for physical access with all the doors in the HDC completely open. As a second embodiment of the invention, an Extremely High-Density Cabinet (EHDC) can supply up to 10,800 Watts of power to its equipment load. The EHDC is discussed in detail below.

The wide rack used as the basis for the HDC is approximately 2'5" wide, 7'4" high and approximately 32" deep. However, with both front and back doors open, and allowing for doors and for other access space, the HDC occupies about 20 sq. ft. Prudent design practice adds approximately 5 more sq. ft. per rack for passage space and ease of access, thus amounting to about 25 sq. ft. per HDC, as a design criterion. The height of an 8"-high cable tray, mounted on top of the HDC, is included in the 7'4" height specified above. The batteries in the HDC are located in the base of the HDC on a battery tray. The UPSs are located at the bottom of the HDC on a hinged-tray in the back of the HDC. This combination takes up the bottom six RUs of the HDC leaving 36 RUs available for production electronic equipment.

Figure 1:
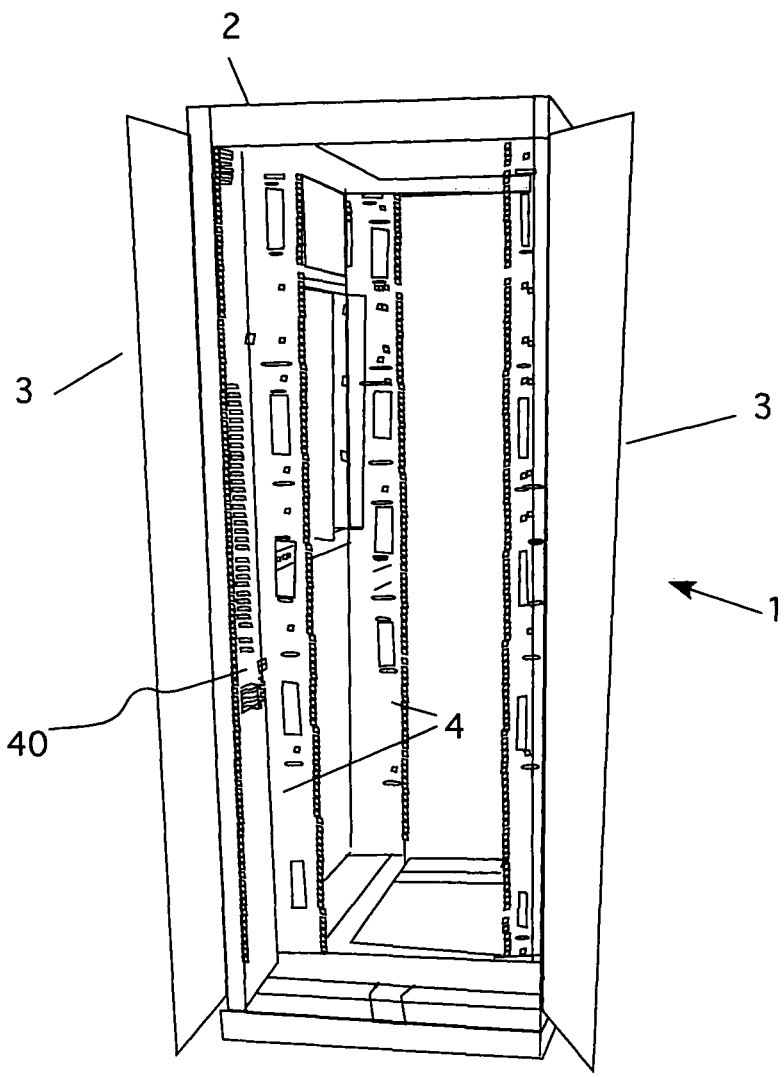
FIG. 1 is a back view of the basic storage unit of the invention with no components installed and the cabinet doors open.

FIG. 1 is a back view of the basic storage unit of an HDC with no components installed and the cabinet doors open. Here, the cabinet 1 has a box frame 2 and two back doors 3. The box frame 2 has side partitions 4 that have access ports that allow wires and cable to be strung in the side partitions. In this figure, a number of DIN-Rail blocks are shown in place on the Din-Rail 40 installed on the side of the cabinet. These are discussed in greater detail below.

Figure 2:
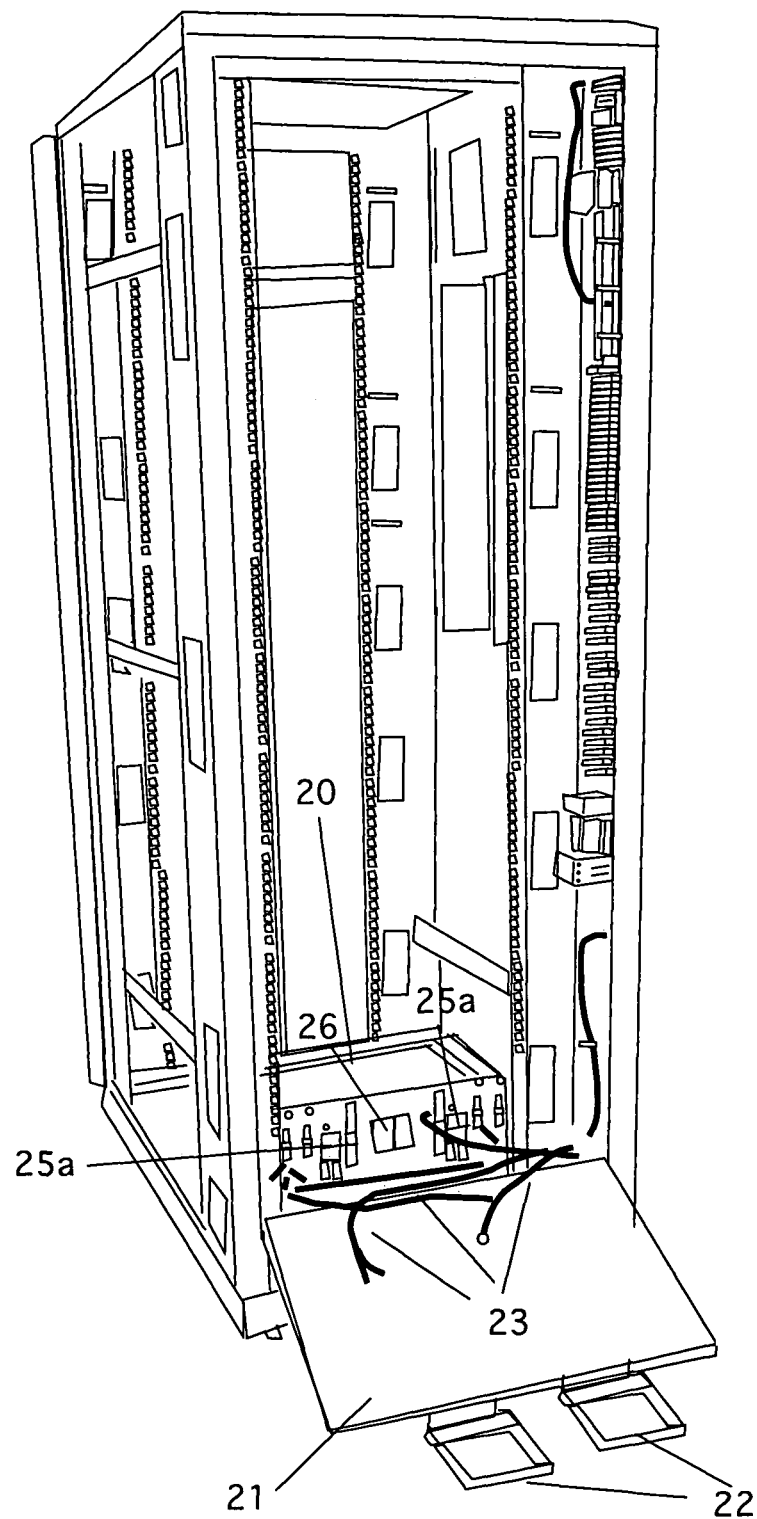
FIG. 2 is a detail perspective view of the invention housing showing the UPS support system installed and the access door open.

FIG. 2 is a detail perspective view of the rear the cabinet showing the UPS support system 9 installed and the UPS access door open. Here, the battery tray 20 is shown mounted in the bottom of the cabinet. An access door 21 is attached to the cabinet to allow access to the wiring 23. The access door has two handles 22 that allow safe operation of the door. Note that this shows the back of the UPS system, which contains the DC power distribution panel 25 and the main fuses 25a for the system. The exact circuitry is discussed below. Note the DIN-Rail and associated components mounted on the right. These are discussed below.

Figure 3:
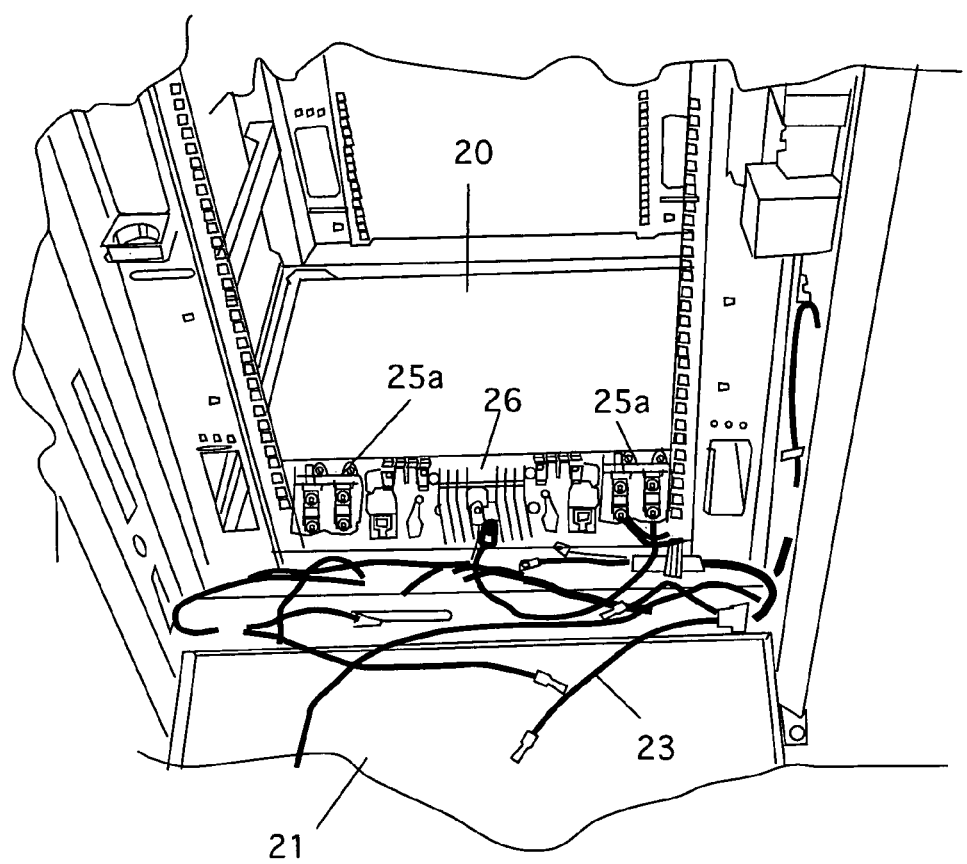
FIG. 3 is a detail view of the UPS support system installed in the housing.

FIG. 3 is an enlarged detail view of the back of the UPS system installed in the housing. Here, the fuses 25a and diodes 26 are shown that are used to protect the system and for charging the batteries that form the core of the UPS system. They are positioned on the battery tray 20.

Figure 4:
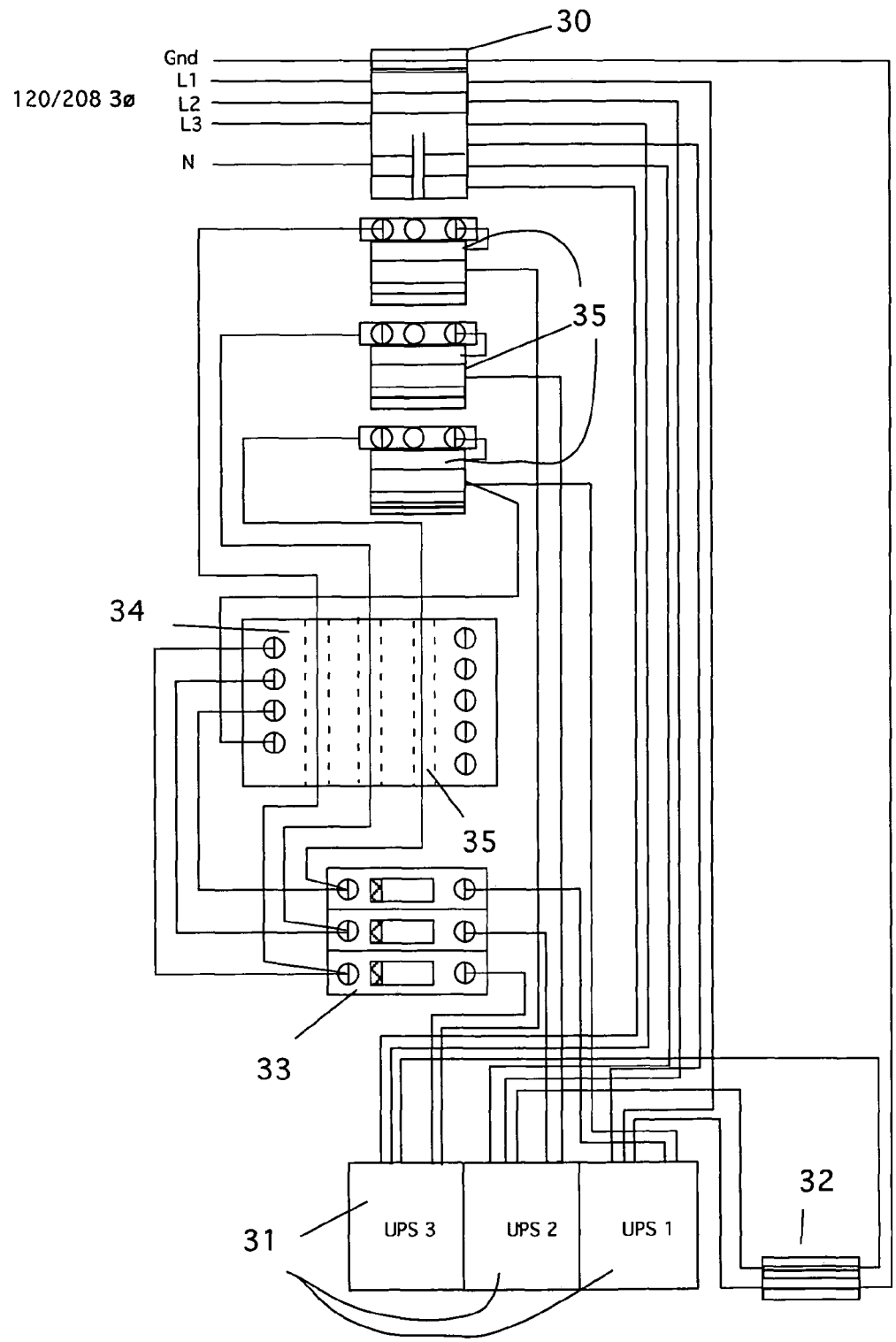
FIG. 4 is a schematic diagram of the overall power distribution system within the housing.

FIG. 4 is a schematic diagram of the overall power distribution system within the housing. Efficient and adequate power distribution within the cabinet and delivery of reliable power to the installed system components (the end use equipment) are the main features of this design. FIG. 4 shows that power as commercial three-phase AC is delivered to the top of the cabinet where it connects to a first set of blocks 30 of the DIN-Rail blocks. In the preferred embodiment, this input power consists of three phases of 120/208 power and includes a neutral and a ground circuit. This power is then transferred to the UPS system 31. In the preferred embodiment, the UPS system has three independent units that are each powered by one of the three input phases (and a neutral). In this way, if for some reason a phase is lost, the entire system does not go down. The ground is transferred to a separate set of grounding blocks 32 that distribute grounds throughout the cabinet. The hot leg outputs of the UPS systems then pass through a set of circuit breakers 33 (in the preferred embodiment rated at 25 amps). The neutrals are run directly to a set of power distribution blocks (part of blocks 35). The hot legs are routed from the circuit breakers in two directions. One set passes through a set of current transformers 34 that make up a part of the power monitor (volts amps watts or VAW monitor). These leads then pass to the main set of power distribution blocks 35 installed in the DIN rails (discussed below in detail). The other set of leads goes to the voltage taps of the VAW monitor 34. In this way, power is efficiently distributed throughout the cabinet while being simultaneously and constantly automatically monitored.

Figure 5:
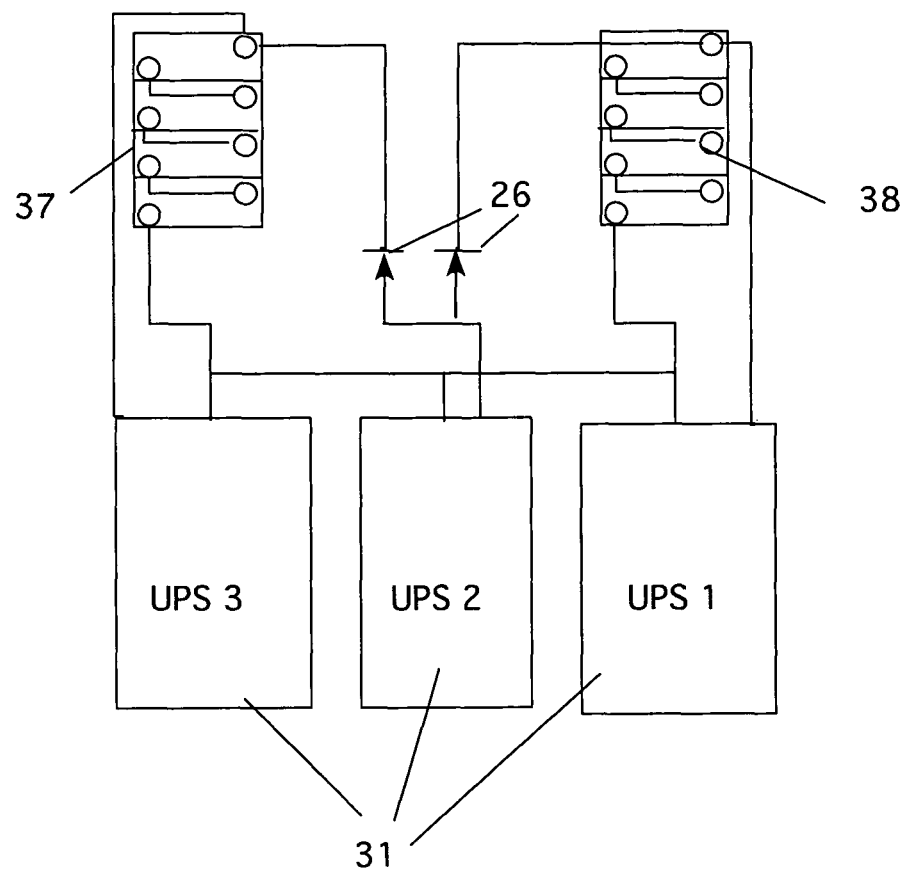
FIG. 5 is a schematic diagram of the battery and UPS wiring configuration for the HDC.

In addition to full 3-phase power, the UPS systems also provide battery backup. In the HDC, eight sealed, 12V, Gel batteries are installed as two four cell battery strings (37 and 38 on FIG. 5), with 110 Amp-Hours available from each battery. When new, these batteries provide 30 minutes of backup power for a fully loaded HDC. Allowing for maximum expected decay over time, the batteries provide for 10 minutes of full-load backup at the end of three years. The batteries sit on the battery tray 20 (see FIGS. 2 and 3). FIG. 5 is a schematic diagram of the battery and UPS wiring configuration for the HDC. To provide the greatest efficiency, the two battery strings 37 and 38 are used to supply the three UPS systems 31. The diagram shows the battery strings are wired in series. One battery string is directly connected to each of the two outer UPS units directly while the third UPS unit is fed by both battery strings through a pair of blocking diodes 39.

Figure 6:
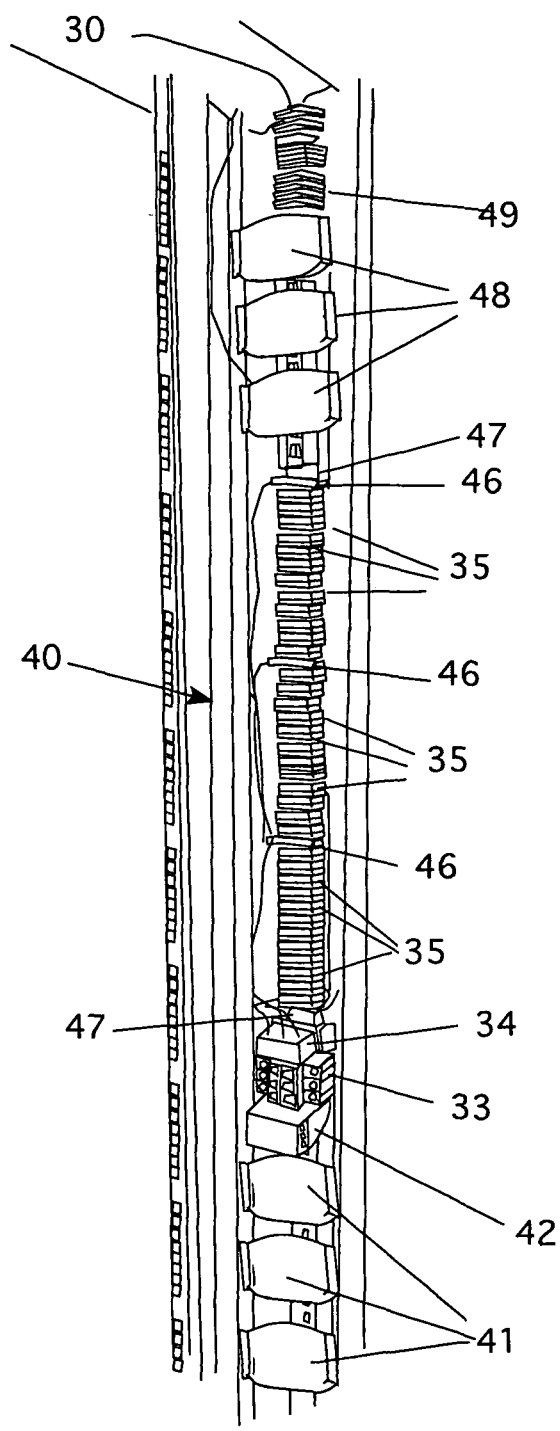
FIG. 6 is a detail view of the internal wiring network using DIN rail blocks and other components.

An ancillary problem that is solved by the HDC is the simple problem of the physical space required to plug in all of the 72 power cables to the available input power. The HDC solution involves the use of DIN-Rail blocks, which allow the safe, accessible, and unobtrusive connection of approximately 72 AC power cords into 36 sets of DIN-Rail blocks, in a space about 18" high by 4" wide and 2" deep. This space is located at the back of the rack, against the side of the HDC, on whichever side of the HDC is appropriate for the application as shown in FIG. 6. The main DIN-Rail 40 is installed in the sides of the cabinet using standard fasteners for the purpose. The DIN blocks are installed typically from the bottom of the rail up. As shown in FIG. 6, at the bottom of the rail, there are three UPS monitoring modules 41 are installed. These monitor the UPS system for voltage and current. Above them is a power supply 42 for the monitoring units. Above them are the three 25-amp circuit breakers 33 (see also FIG. 4). Above them is a CRD5170-150-25 multifunction transducer 44. This senses voltage and current in the system. Next, a grey stop block 47 is installed. Above that, twelve 120-volt wiring assemblies 35 (on FIG. 4) are installed. Each of these assemblies consists of three DIN blocks assembled from bottom to top as follows: One green/yellow DIN block, one white DIN block, and one black DIN block. The green/yellow block is used for the ground, white is neutral and black is for line voltage.

Above the 12 block assemblies is a grey indicator block 46 that has a small indicator light installed. Then, 12 more assemblies 35 and a second grey indicator block 46 are installed. Finally, 12 more assemblies 35 and a third grey indicator block 46 are installed on the rack. Above that is a grey stop block 47. After that, a short space is left in the rail as shown. Above that, three temperature monitoring modules 48 are installed followed by additional green and yellow blocks 49. At the top are the blue, red and black DIN blocks 30 (see FIG. 4).

As discussed above, these DIN-Rail blocks are fed from three, 3600 W UPSs, nominally one per phase of the incoming AC power. Each phase of filtered power (i.e., UPS output) is separately protected from any equipment short by an individual circuit breaker mounted on the DIN-Rail. These UPSs are rated at 3600 W for one hour; however, they are derated to 2400 W for continuous use. At full load, an HDC is fed by 220V AC, 3-phase, 30 A per phase, building power. Obviously, an HDC can be configured with a smaller electrical feed and with concomitantly smaller available total power, but with a tolerance for longer power outages.

Figure 6A:
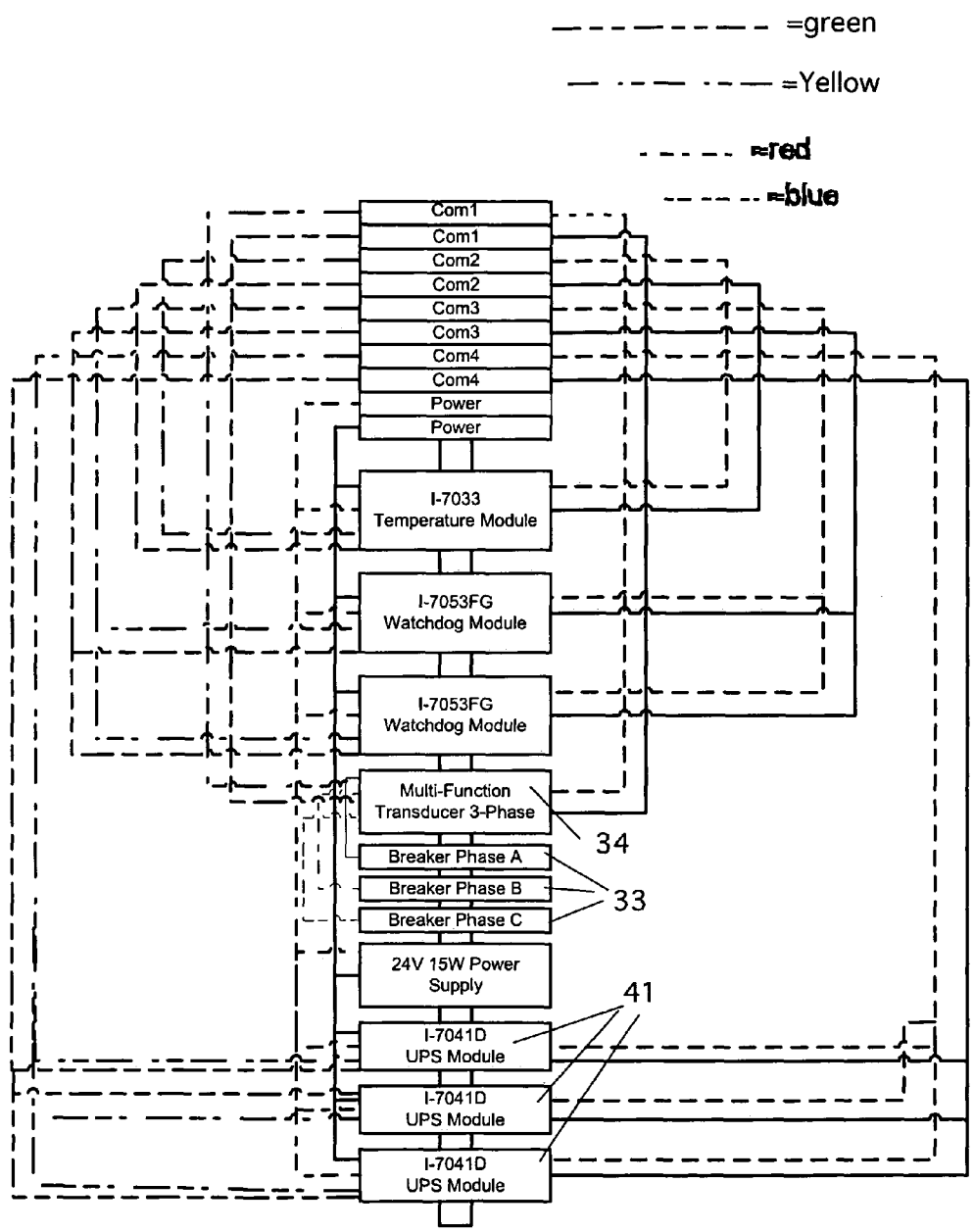
FIG. 6a is an electrical schematic diagram of the components shown in FIG. 6.
Figure 6B:
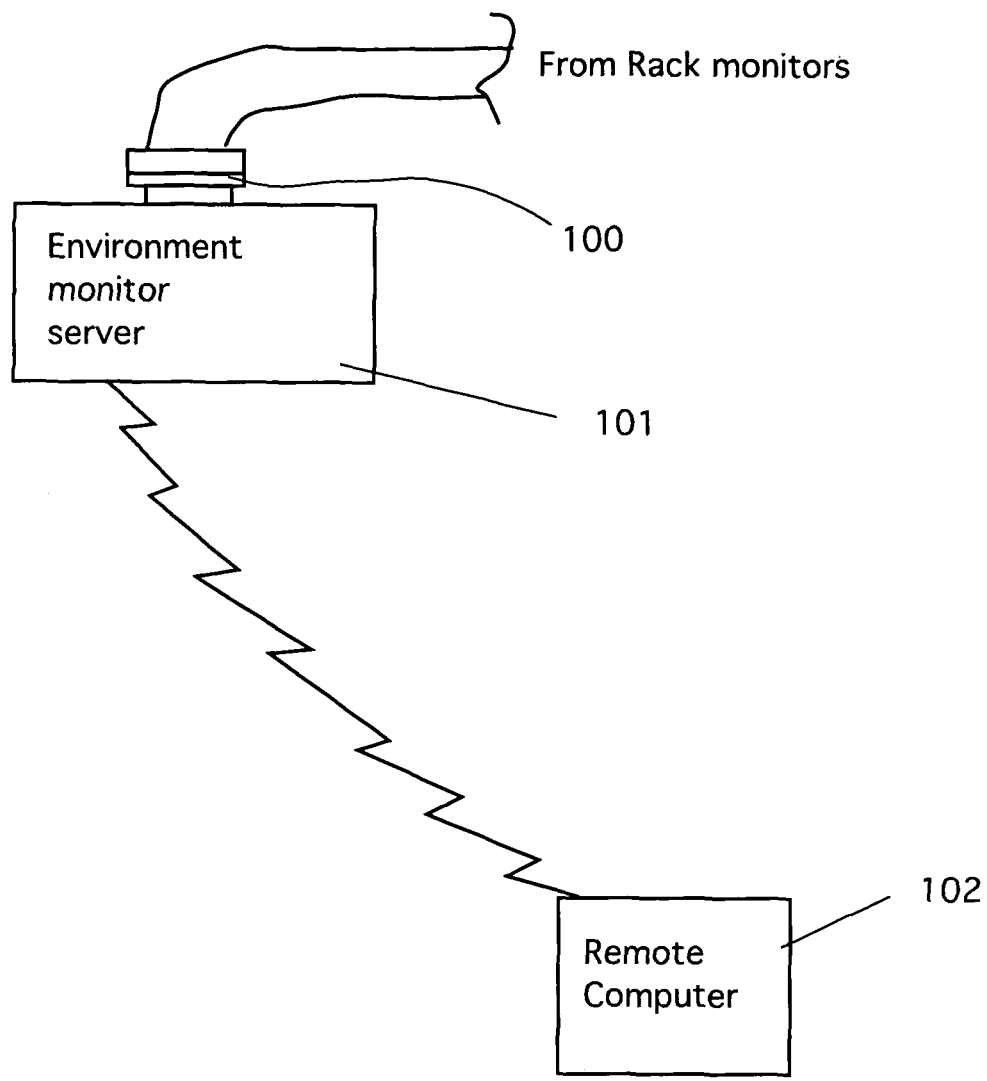
FIG. 6b is a schematic diagram of the remote monitoring systems.

FIG. 6*a* is an electrical schematic diagram of the components shown in FIG. 6. Note that the power and communication (com) ports shown at the top of the figure extend down through the channel as shown in FIG. 6. This repeating pattern allows for many pick-up points for power or communications, as needed in the frame. The temperature and watchdog modules are designed to monitor conditions within the cabinet, including environmental conditions as well as the conditions of the power-both incoming power and the standby UPS power. In the diagram, the dashed lines on the right show logic connections between the modules and those on the left show physical connections. The logic communication connections on the left daisy chain from rack to rack and terminate in a 37 pin connector 100 that attaches to a card in an environment monitoring server 101 (see FIG. 6*b*). This server communicates with an off-site computer 102 so that remote monitoring of the rack is possible almost anywhere in the world. The AC power lines (thin dashed on left) run from the distribution harness and connect to the multifunction transducer 34. The heavier dashed lines represent data flow (both transmitted and received. In this way, all power and communications systems in the rack are monitored in real time from any desired location. This allows the units to be kept in remote locations without the need for regular inspection by personal.

Figure 7:
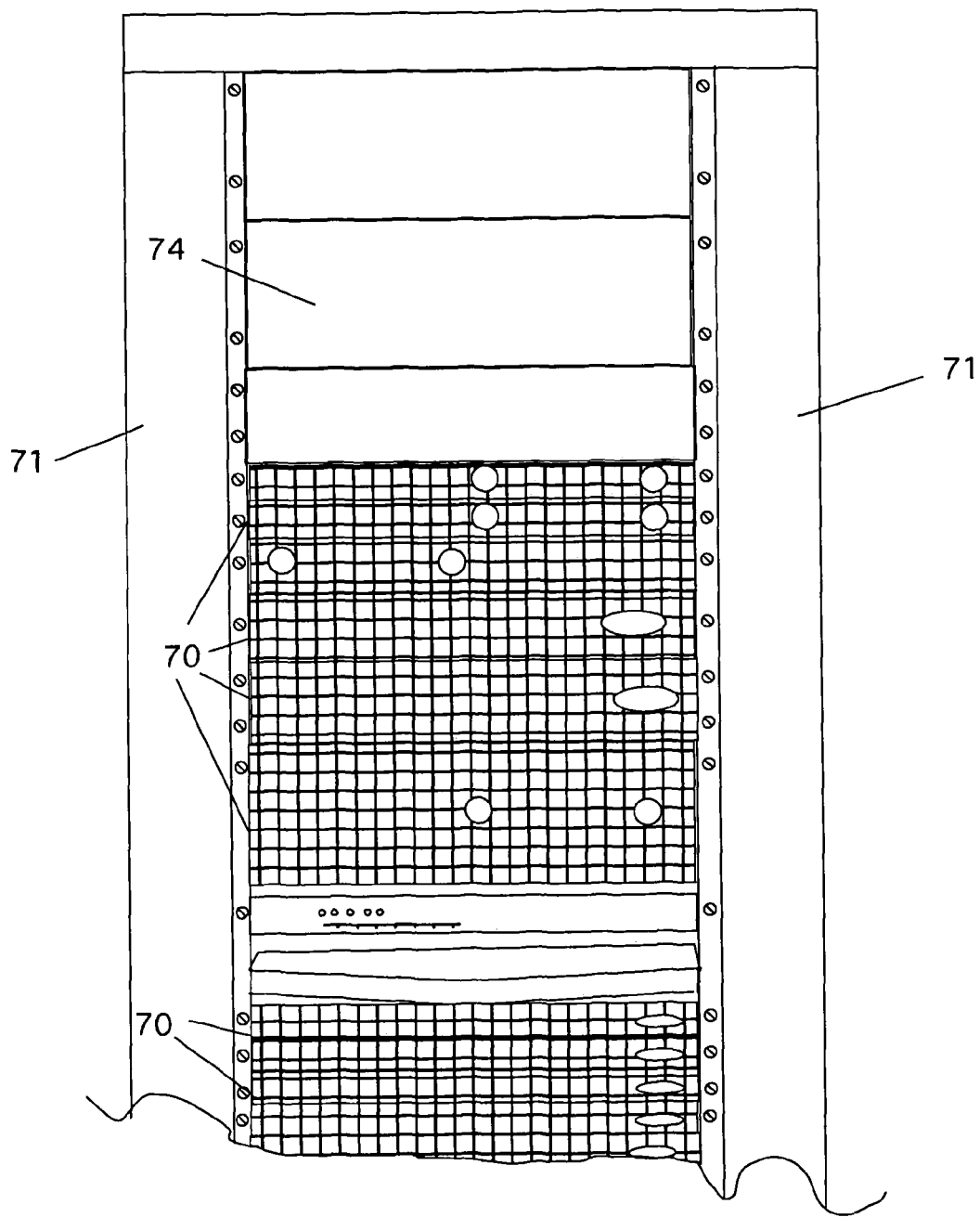
FIG. 7 is a detail view of a portion of the front of a unit with the cabinet door open, showing equipment in place within the cabinet.

FIG. 7 is a detail view of a portion of the front of a unit with the doors open, showing exemplar equipment in place within the cabinet. Note that this equipment is not part of the design. However, these figures show possible installation configurations using various pieces of equipment.

As shown, several pieces of electronic equipment 70 are in place within the cabinet. In normal cabinets, these devices would extend to the outer edges of the cabinet, which requires all wiring to be run in the back of the unit. Here, however, the two alleys, 71 on both sides and in the top of the unit, allow for easy wiring that leaves the back of the unit open for servicing. Three blank panels 72 are installed at the top of the unit to fill in the space when it is not occupied by other electronics.

Figure 8:
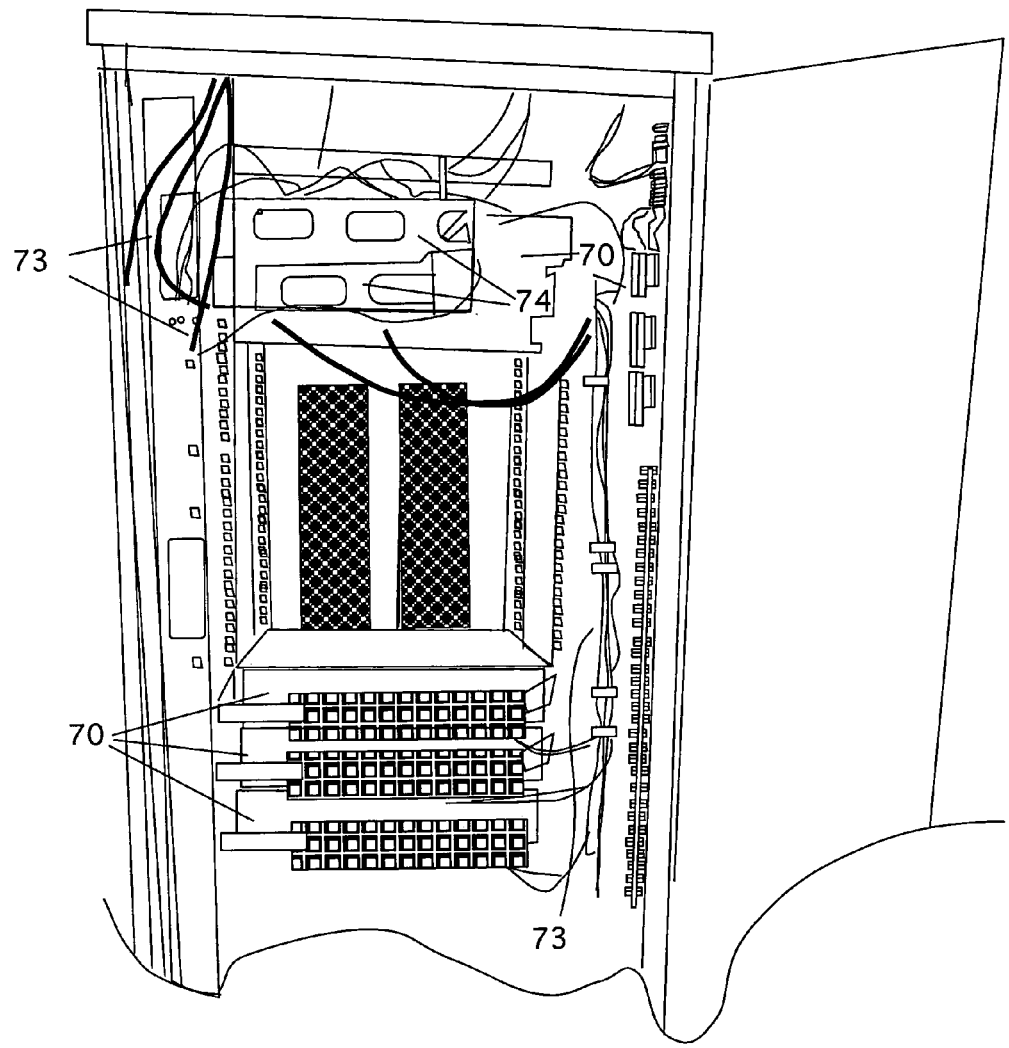
FIG. 8 is a detail view of a portion of the rear of the unit showing exemplar equipment in place.

FIG. 8 is a detail view of a portion of the rear of the unit showing exemplar equipment in place. Here, several pieces of equipment 70 are shown, with a large gap in between. Note the absence of complex wiring filling the back of the cabinet. Note also, the neat wiring bundles 73 being run in the side alleys. Note also the cable management arms 74 that are installed within the cabinet.

Figure 9:
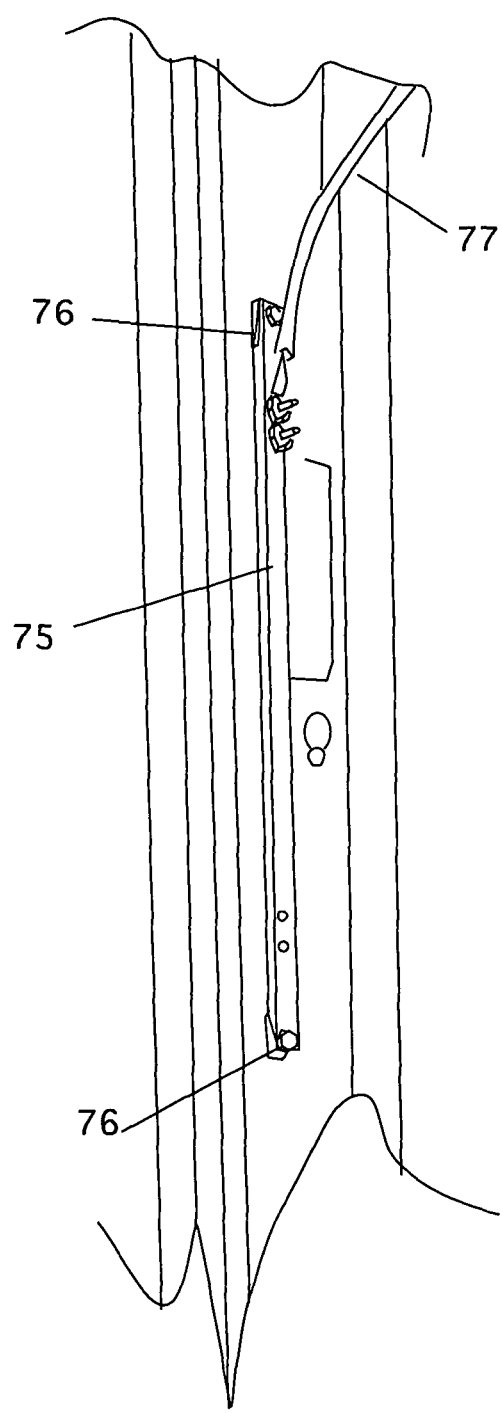
FIG. 9 is a detail view of the grounding bar, located in the rear of the unit.

FIG. 9 is a detail view of the grounding bar, located in the rear of the unit. The grounding bar 75 is a large copper bar that is secured to the side wall of the cabinet with bolts and spacers 76. A main grounding conductor 77 is bolted to the bar as shown.

Figure 10:
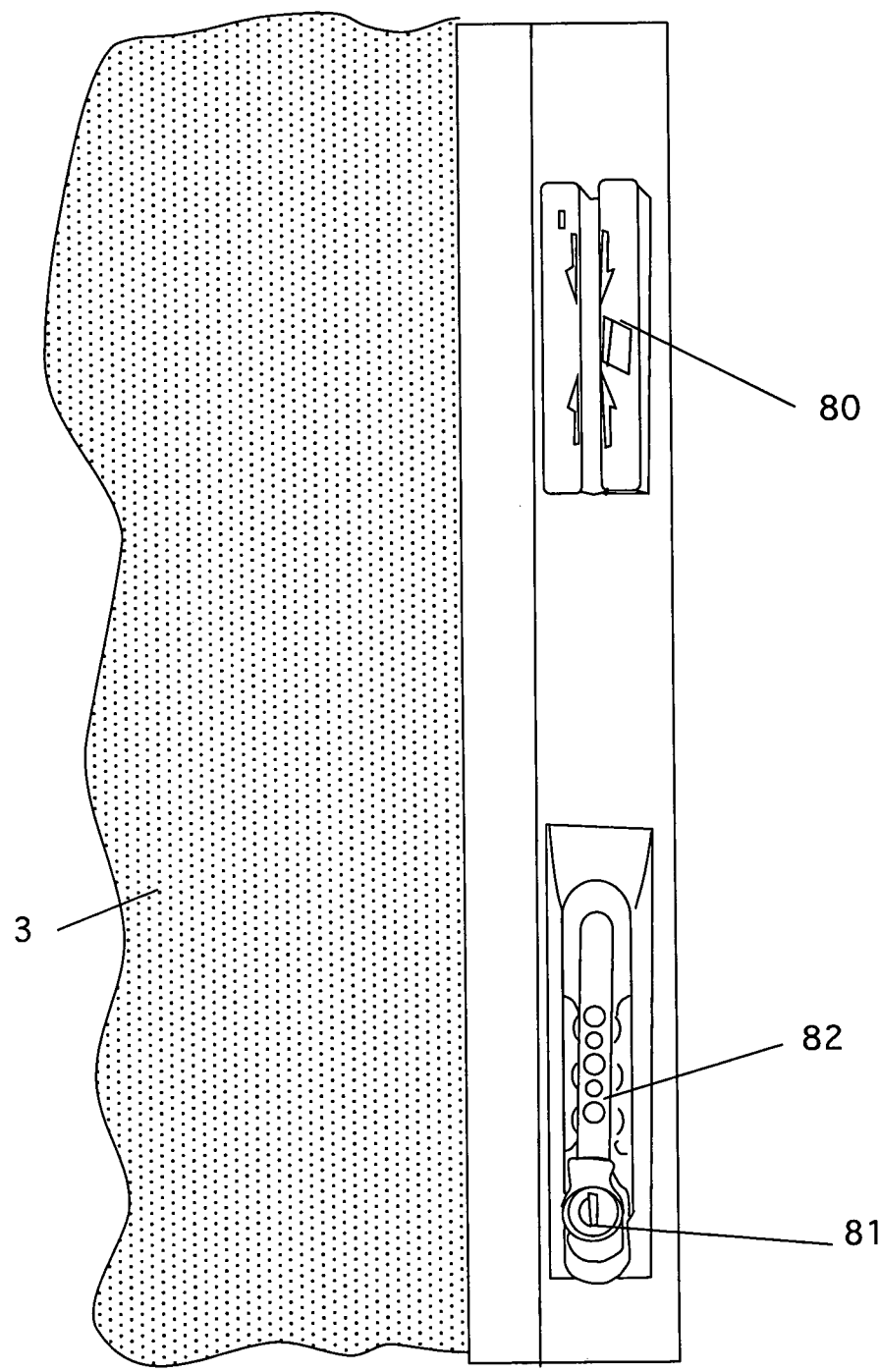
FIG. 10 is a detail of a card lock system for the door of the housing.

One of the unique aspects of these cabinets is the locking system. FIG. 10 is a detail of a card lock system for the door of the housing. Unlike other cabinet designs, these units can have an optional card reader 80 as well as more standard key locks 81, and combination locks 82.

Figure 11:
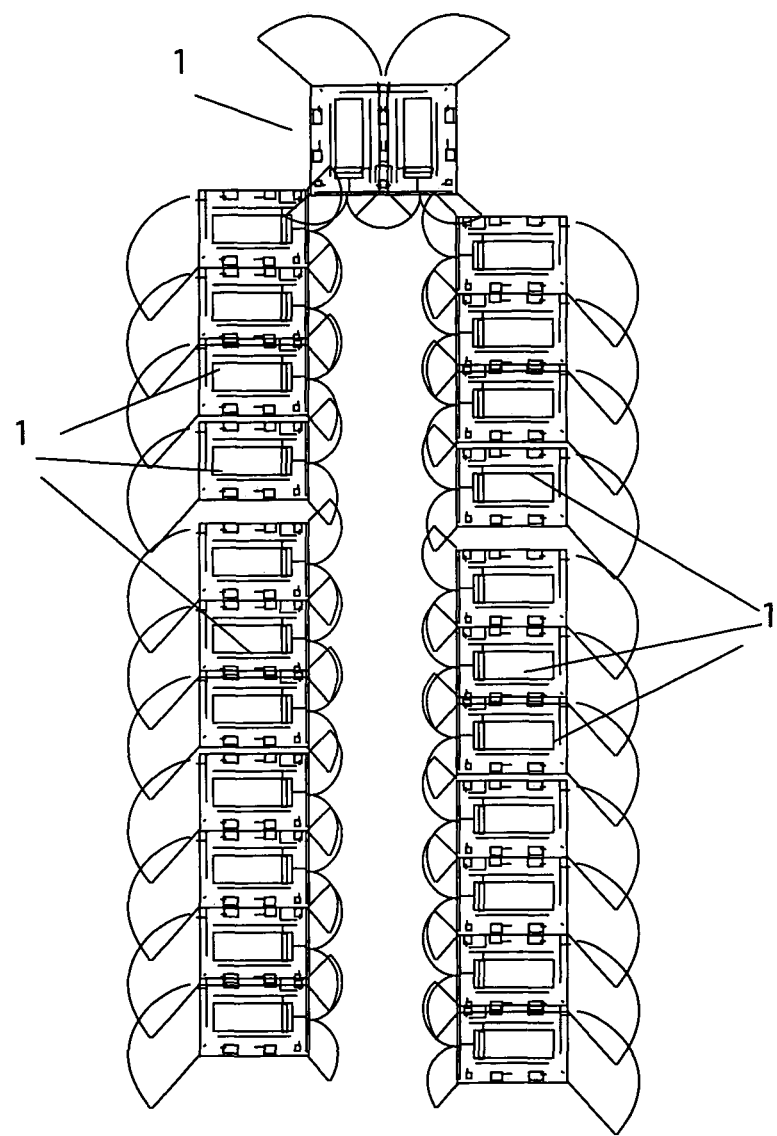
FIG. 11 is a top detail view showing a number of independent rack units installed in a working environment.

These units are designed to operate singly or in a series, depending on the size of the operation. FIG. 11 is a top detail view showing a number of independent rack units installed in a datacenter. The arced lines indicate the path of the door swing. Installed in this manner, several units can be combined for maximum utilization in the minimum of space.

Figure 12:
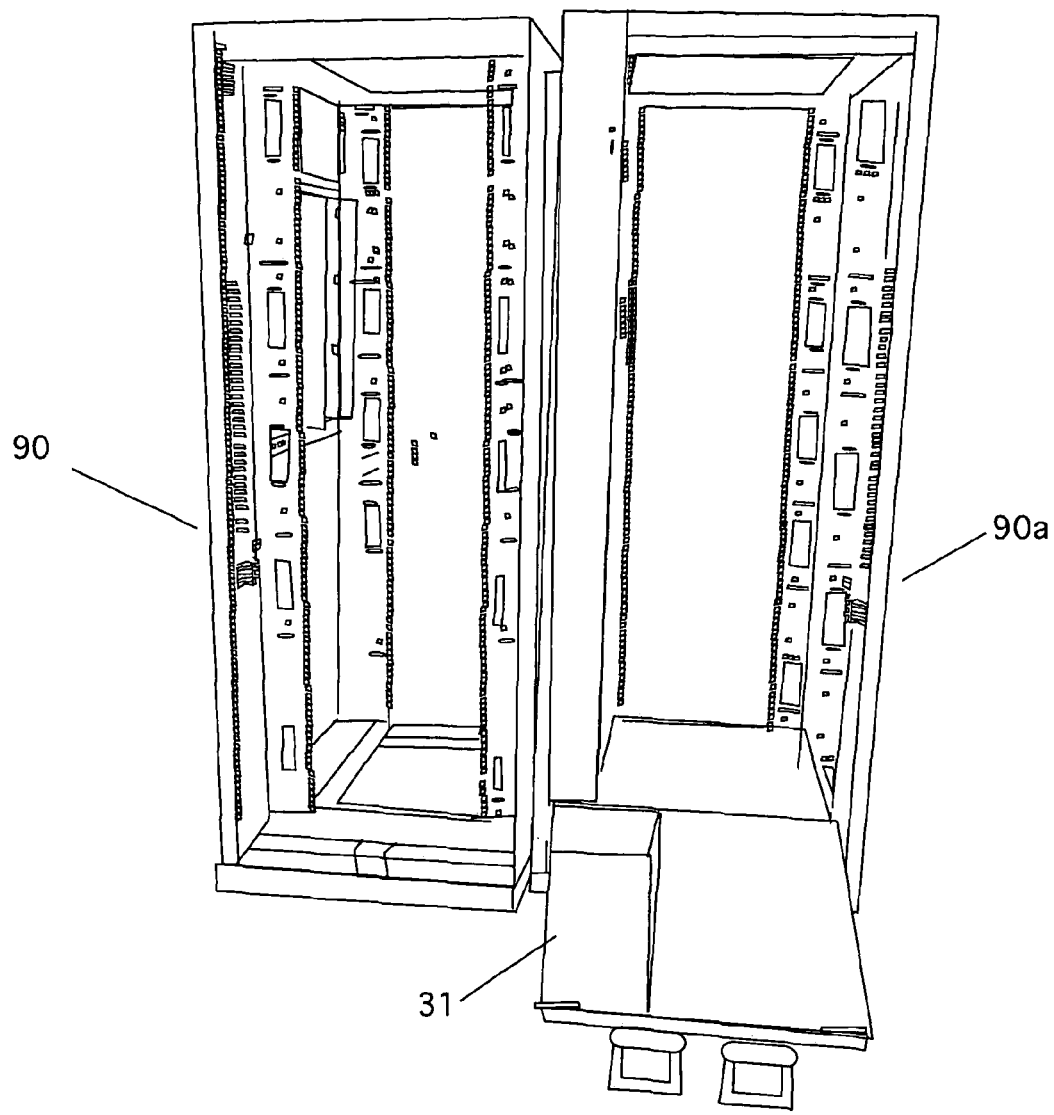
FIG. 12 is a second embodiment of the invention in which two cabinets are connected and are served by one UPS power supply
Figure 13:
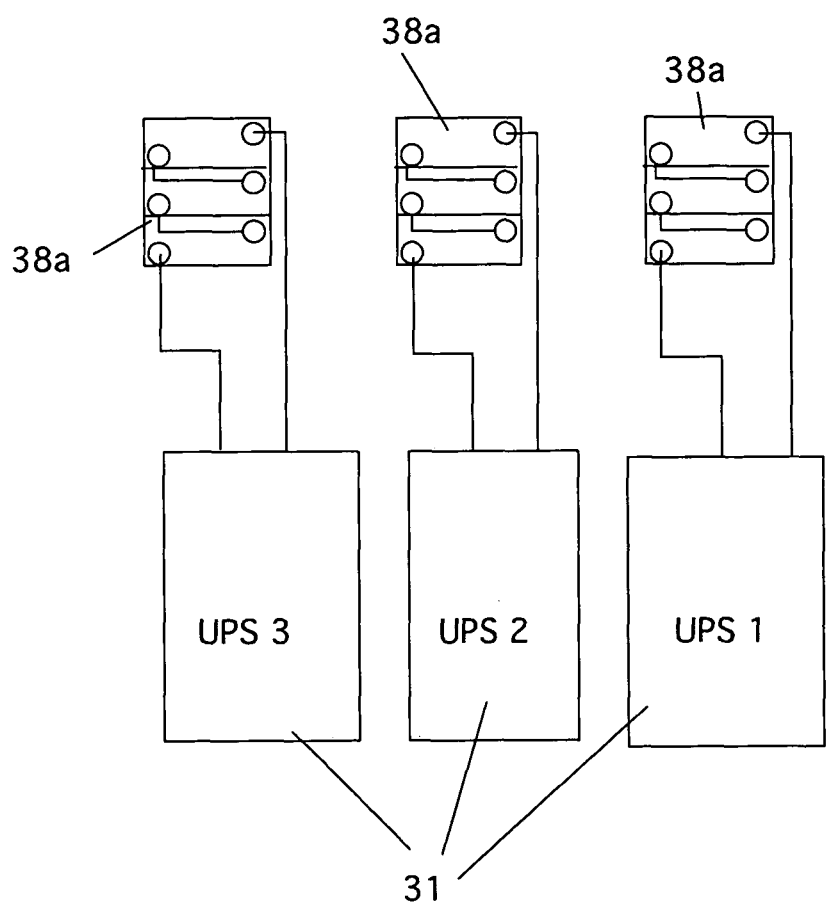
FIG. 13 is a schematic diagram of the battery and UPS wiring configuration for the EHDC.

FIG. 12 is a second embodiment of the invention in which two cabinets are connected and are served by one UPS power supply. Here, instead of many single cabinets, each with its own power supply, two cabinets can be connected that share one power supply. As shown, the cabinets 90 and 90*a* are interconnected. Only one UPS system 31 (note only one unit is shown, three are standard) is placed in the bottom of cabinet 90*a*. Again, a full set of battery strings and their associated wiring is also installed in the one cabinet as discussed above.

FIGS. 13 and 14-17 describe the battery configuration in an EHDC. The battery configuration for the HDC was discussed above. FIG. 5*a* is a schematic diagram of the battery and UPS wiring configuration for the EHDC. Here, three batteries (of three cells each) 38*a* are shown, each connected to one of the three UPS units 31

Figure 14:
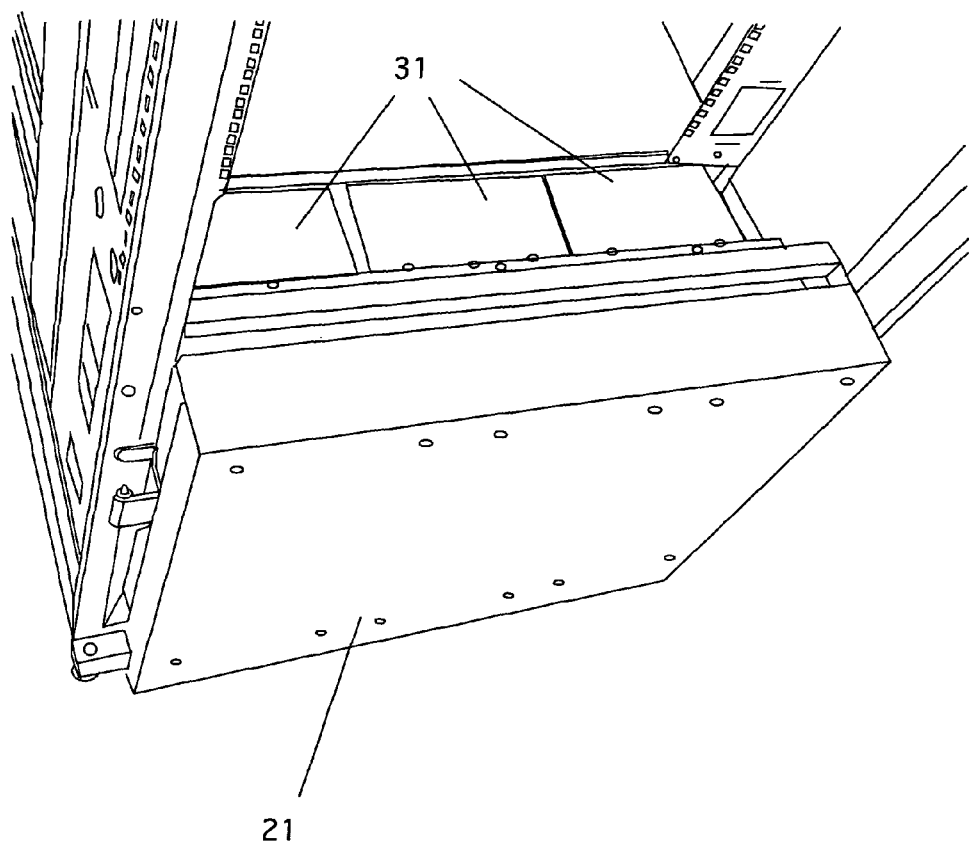
FIG. 14 is a detail of the battery storage configuration for the EHDC showing the UPS door closed.

FIG. 14 is a detail of the battery trays showing the UPS access door 21 closed. The UPSs 31 are kept on this door. Here, the units are stowed for use.

Figure 14A:
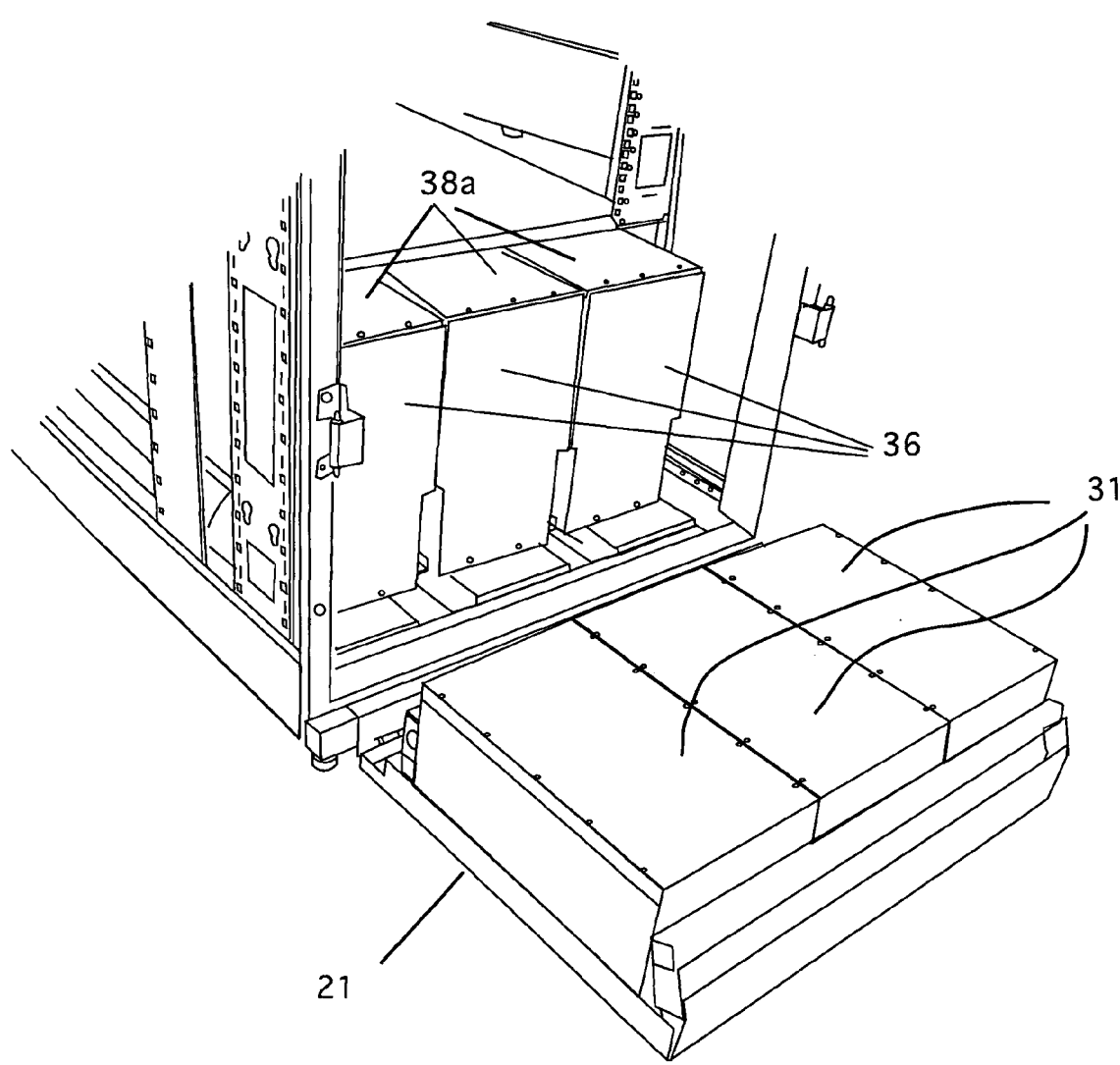
FIG. 14a is a detail of the battery storage configuration for the EHDC showing the UPS door open.

FIG. 14a shows the hinged door 21 open. Here, the battery trays 36 are shown.

Figure 15:
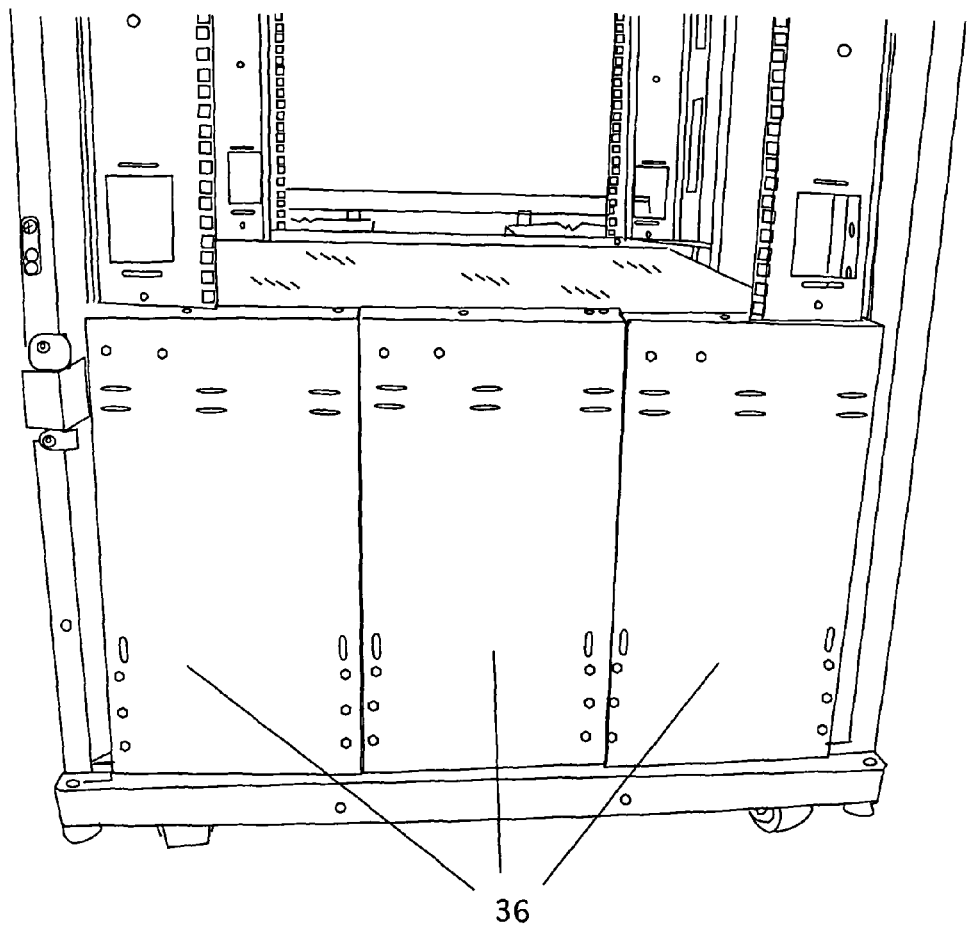
FIG. 15 is a front view of the preferred installation of the battery tray configuration for the EHDC without the cabinet door.

FIG. 15 is a front view of the preferred installation of the battery trays 36.

Figure 16:
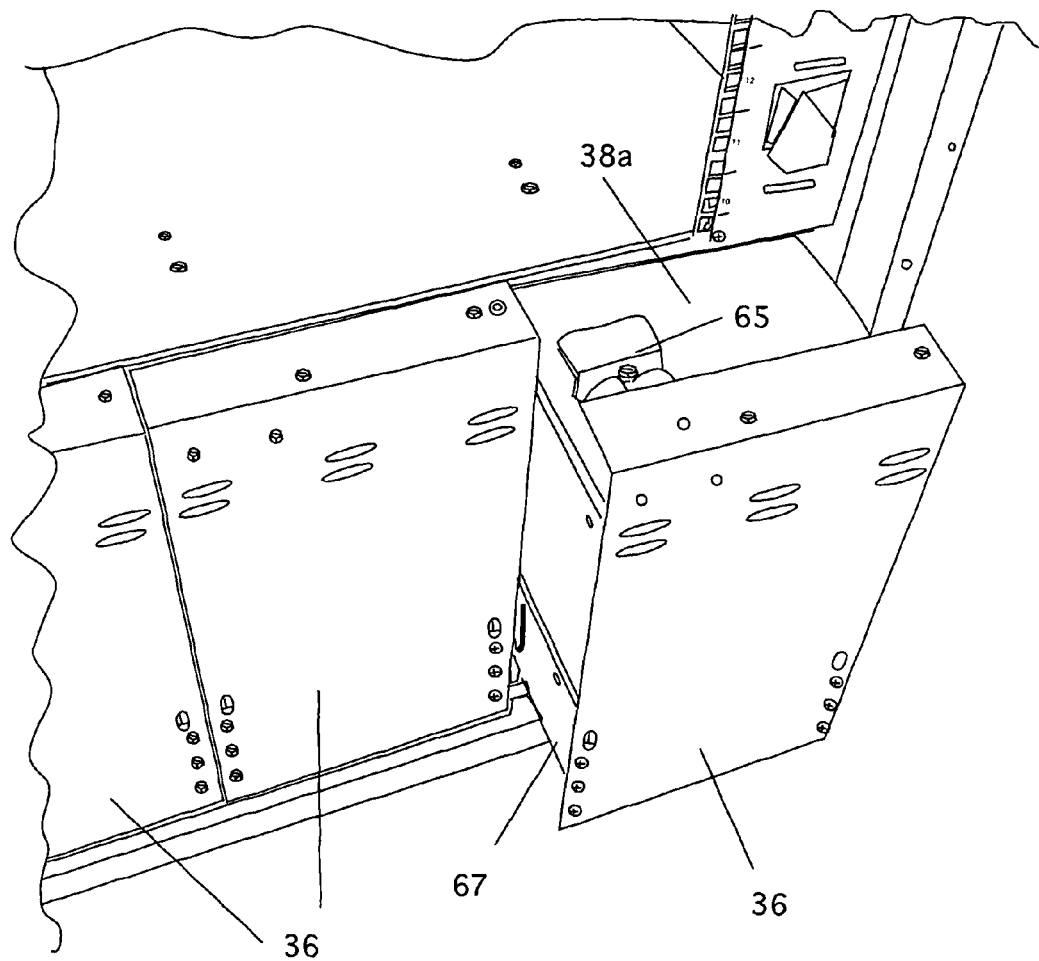
FIG. 16 is a detail view showing one of the battery trays for the EHDC being extended from the housing.

FIG. 16 is a detail view showing one of the battery trays 36 being extended from the housing. These units are mounted on slides 67 that permit their removal for servicing or replacement. Note also the DC connector 65 that connects the battery 38a to the UPS 31.

Figure 17:
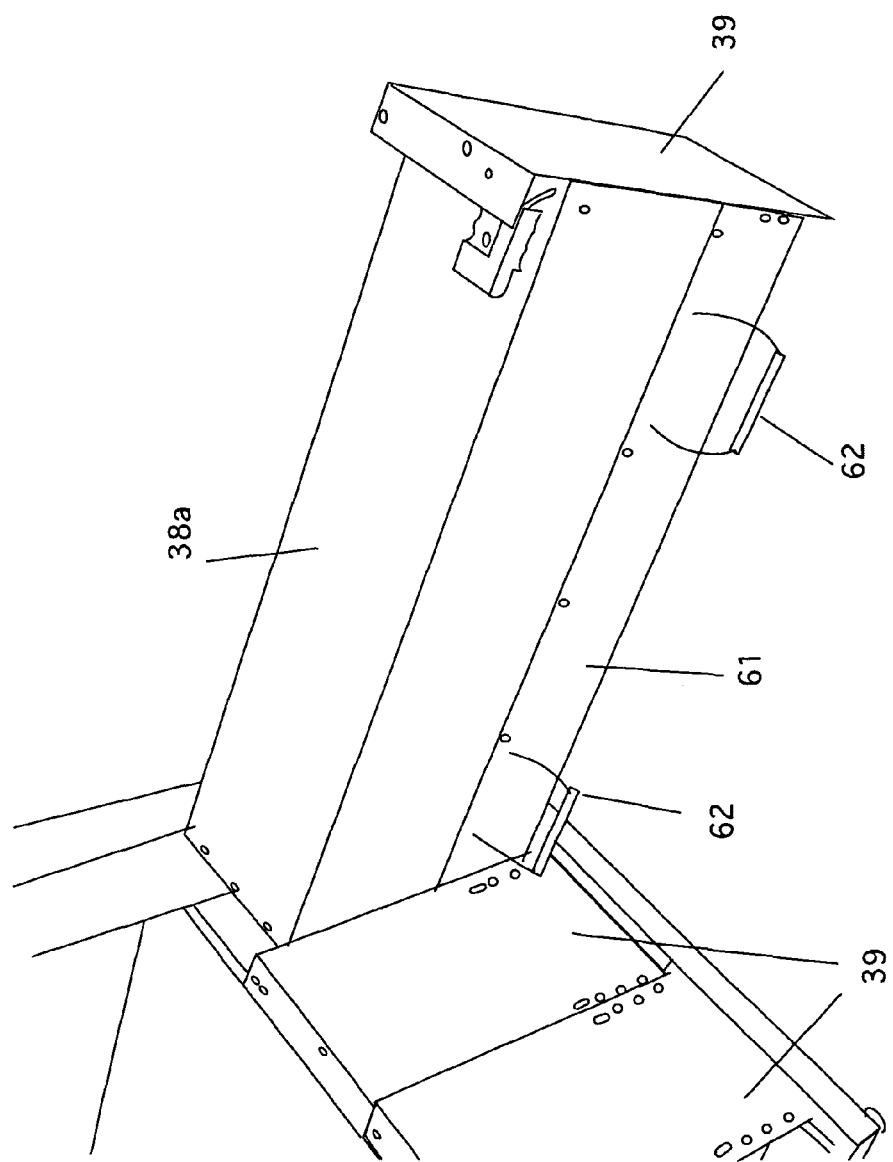
FIG. 17 is a detail view of a battery tray for the EHDC being fully extended and accessible for servicing.

FIG. 17 is a detail view of a battery 38a being fully extended and accessible for servicing. Four handles 62 (including two handles on the other side, which are not shown) are provided to lift the unit out of its cradle. Because of the weight of the unit, four handles are needed to allow for safe movement of the unit.

At some point, nominally on a three-year cycle, optimal protection requires that the batteries be replaced. While it is simpler and safer to replace the batteries after first completely powering down all equipment in the unit, replacing the batteries in the HDC can be done without interrupting operation of equipment in the top 28 RUs of available space. Equipment in the bottom 8 RUs must be removed to allow safe removal and replacement of the batteries. In the case of the EHDC, the batteries can be changed without having to remove equipment by using the trays, as discussed above.

As implemented, the device has no inherent Single Point-of-Operational-Failure (SPOF). The monitoring components in the device are not redundant, but loss of monitoring does not affect equipment operations. Moreover, as discussed above, in the HDC, the batteries are cabled as two strings of four batteries in series. The resulting 48V DC from each battery string is the input to two UPSs. The left UPS is powered by the left battery string; the right UPS is powered by the right battery string; and the center UPS is powered by both battery strings through two diodes. All connections are fused. Thus, either battery string can fail and still allow two UPSs to provide power to two separate electrical phases, thereby allowing all rack-mounted equipment to continue in full operation. Likewise, any single UPS can fail and power will still be provided to two separate electrical phases.

The EHDC expands the capabilities of the HDC by using three 5400 W UPSs. These units are derated to 3600 W for continuous use. An additional sealed, 12V, Gel battery is added to get nine batteries. The nine batteries are cabled as three strings of three batteries each—thus providing 36V DC input to the UPSs, with no SPOF. The EHDC can manage up to 10,800 W of filtered, backed-up, power. Additionally, if the power supplied to the EHDC from the building supply is Neg-48, then the UPSs can be much simpler, and consist mainly of very-high-capacity DC-to-DC converters with the associated control circuitry.

The present disclosure should not be construed in any limited sense other than that limited by the scope of the claims having regard to the teachings herein and the prior art being apparent with the preferred form of the invention disclosed herein and which reveals details of structure of a preferred form necessary for a better understanding of the invention and may be subject to change by skilled persons within the scope of the invention without departing from the concept thereof.

We claim:

1. An electronics rack comprising:
   a frame configured to support electronic equipment;
   a partition at a side of the frame;
   a wiring alley positioned at a side of the frame, wherein the wiring alley is configured to receive wires that are coupled with the electronic equipment and is configured to distance the wires that are received therein from a back region of the frame, and wherein the partition defines access ports through which wiring can be strung from the electronic equipment into the wiring alley;
   an input power supply mounted to the frame, wherein the input power supply receives power from a source that is external to the frame;
   an uninterruptible power supply positioned within the frame and electrically coupled with the input power supply, wherein the uninterruptible power supply receives power from the input power supply and conditions the power received from the input power supply to a condition suitable for delivery to the electronic equipment;
   two additional uninterruptible power supplies, wherein the input power supply receives AC power in three phases, and wherein each uninterruptible power supply is powered by a different one of the three phases;
   a battery positioned within the frame and electrically coupled with the uninterruptible power supply, wherein the battery is configured to provide a supply of backup power to the uninterruptible power supply;
   a rail at the side of the frame; and
   a plurality of wiring assemblies mounted to the rail, wherein each wiring assembly receives power from the uninterruptible power supply and is configured to provide power to the electronic equipment.

2. The electronics rack of claim 1, wherein the uninterruptible power supply is installed on a hinged door at a base of the rack, and wherein the hinged door opens in a rearward direction.

3. The electronics rack of claim 2, wherein the battery is positioned at the base of the rack and in front of the uninterruptible power supply, wherein the battery is positioned in an extendable cradle mounted on slides, wherein the cradle is movable in a forward direction so as to permit the battery to be removed from the cradle.

4. The electronics rack of claim 1, wherein the uninterruptible power supplies are all installed on a hinged door side-by-side at a base of the rack, and wherein the hinged door opens in a rearward direction.

5. The electronics rack of claim 4, further comprising one or more additional batteries positioned within the frame and configured to provide a supply of backup power, wherein each battery is electrically coupled with one or more of the uninterruptible power supplies and is positioned in an extendable cradle mounted on slides, and wherein each cradle is movable in a forward direction so as to permit the battery that is positioned therein to be removed from the cradle.

6. An electronics rack comprising:
   a frame configured to support electronic equipment;
   an input power supply mounted to the frame, wherein the input power supply receives power from a source that is external to the frame, and wherein the input power supply receives AC power in three phases;
   a first uninterruptible power supply positioned within the frame and electrically coupled with the input power supply, wherein the first uninterruptible power supply receives power from the input power supply and conditions the power received from the input power supply to a condition suitable for delivery to the electronic equipment;
   a second uninterruptible power supply electrically coupled with the input power supply;
   a third uninterruptible power supply electrically coupled with the input power supply, wherein each of the first, second, and third uninterruptible power supplies is powered by a different one of the three phases;

a battery positioned within the frame and electrically coupled with the first uninterruptible power supply, wherein the battery is configured to provide a supply of backup power to the first uninterruptible power supply; and a plurality of wiring assemblies electrically connected to the first uninterruptible power supply and configured to provide power to the electronic equipment.

7. The electronics rack of claim 6, wherein the second and third uninterruptible power supplies are positioned within the frame.

8. The electronics rack of claim 6, wherein the battery is electrically coupled with the second and third uninterruptible power supplies.

9. The electronics rack of claim 6, wherein the first uninterruptible power supply is installed on a hinged door at a base of the rack, and wherein the hinged door opens in a rearward direction.

10. The electronics rack of claim 9, wherein the battery is positioned at the base of the rack and in front of the uninterruptible power supply, wherein the battery is positioned in an extendable cradle mounted on slides, wherein the cradle is movable in a forward direction so as to permit the battery to be removed from the cradle.

11. The electronics rack of claim 10, wherein the first, second, and third uninterruptible power supplies are all installed side-by-side on the hinged door at a base of the rack.

12. The electronics rack of claim 11, further comprising one or more additional batteries positioned within the frame and configured to provide a supply of backup power, wherein each battery is electrically coupled with one or more of the first, second, and third uninterruptible power supplies and is positioned in an extendable cradle mounted on slides, and wherein each cradle is movable in a forward direction so as to permit the battery that is positioned therein to be removed from the cradle.

13. The electronics rack of claim 6, wherein the first, second, and third uninterruptible power supplies are all installed side-by-side on a hinged door at a base of the rack.

14. The electronics rack of claim 6, further comprising one or more additional batteries positioned within the frame and configured to provide a supply of backup power, wherein each battery is electrically coupled with one or more of the first, second, and third uninterruptible power supplies and is positioned in an extendable cradle mounted on slides, and wherein each cradle is movable so as to permit the battery that is positioned therein to be removed from the cradle.

15. An electronics rack comprising:
a frame configured to support electronic equipment;
an input power supply mounted to the frame, wherein the input power supply receives power from a source that is external to the frame, and wherein the input power supply receives AC power in three phases;
a first uninterruptible power supply positioned within the frame and electrically coupled with the input power supply, wherein the first uninterruptible power supply receives power from the input power supply and conditions the power received from the input power supply to a condition suitable for delivery to the electronic equipment;
a second uninterruptible power supply electrically coupled with the input power supply;
a third uninterruptible power supply electrically coupled with the input power supply, wherein each of the first, second, and third uninterruptible power supplies is powered by a different one of the three phases; and
a plurality of wiring assemblies electrically connected to the first uninterruptible power supply and configured to provide power to the electronic equipment.

16. The electronics rack of claim 15, wherein the second and third uninterruptible power supplies are positioned within the frame.

17. The electronics rack of claim 15, wherein the first uninterruptible power supply is installed on a hinged door at a base of the rack.

18. The electronics rack of claim 17, wherein the second and third uninterruptible power supplies are installed on the hinged door alongside the first uninterruptible power supply.

* * * * *